United States Patent [19]
Breuer

[11] 4,083,043
[45] Apr. 4, 1978

[54] HIGH SPEED MONOLITHIC A/D CONVERTER UTILIZING STROBE COMPARATOR

[75] Inventor: David R. Breuer, Malibu, Calif.
[73] Assignee: TRW Inc., Redondo Beach, Calif.
[21] Appl. No.: 658,974
[22] Filed: Feb. 18, 1976
[51] Int. Cl.² ............................................ H03K 13/02
[52] U.S. Cl. ............................................ 340/347 AD
[58] Field of Search ................. 340/347 AD; 235/154

[56] References Cited
U.S. PATENT DOCUMENTS

| | | | |
|---|---|---|---|
| 3,072,332 | 1/1963 | Margopoulos | 235/154 |
| 3,167,757 | 1/1965 | D'Aquila | 340/347 AD |
| 3,234,544 | 2/1966 | Marenholtz | 340/347 AD |
| 3,241,135 | 3/1966 | Kuflik | 340/347 AD |

OTHER PUBLICATIONS

Breuner, "International Solid States Circuit Conference Proceedings," Feb. 1972, pp. 146–147 and 228.
Breuer, "International Solid State Circuits Conference Proceedings," Feb. 1975, pp. 126–127.

Primary Examiner—Charles D. Miller
Attorney, Agent, or Firm—John J. Connors; Robert W. Keller; Jerry A. Dinardo

[57] ABSTRACT

A high speed monolithic A/D converter utilizes a strobed comparator, low level differential logic and thin film resistor integrated circuit processing. The A/D converter is of the successive approximation type and quantizes 10 bits at a 5 megasample rate.

2 Claims, 4 Drawing Figures

HIGH SPEED MONOLITHIC A/D CONVERTER UTILIZING STROBE COMPARATOR

BACKGROUND OF THE INVENTION

This invention relates to Analog-to-Digital (A/D) converters especially designed for fabrication of its entire circuitry on a single semiconductor chip and characterized by high speed, low power performance.

Heretofore A/D converters that perform within the general performance range of 10 bits at 5 megasamples have been fabricated with discrete components or with hybrid techniques, resulting in high power levels and high fabrication cost. There has been a long felt need for an A/D converter which can be mass produced at low cost utilizing integrated circuit techniques, and offering the above performance characteristics together with the higher reliability levels which are realizable by the use of well proven integrated circuit techniques.

SUMMARY OF THE INVENTION

In an analog-to-digital converter of the kind using a successive approximation algorithm to quantize an analog signal by sequentially comparing the analog signal with the output of a digital-to-analog converter which has been programmed to test $n$ bits at a time, where $n$ is an integer of 1 or larger, starting with the most significant bit(s) and ending with the least significant bit(s), the comparing means incorporates a strobing function. The strobing function converts a low level analog signal into a high level digital signal by introducing positive feedback immediately after the low level comparison has been made.

DESCRIPTION OF THE PREFERRED EMBODIMENT

One preferred form of this A/D converter uses a single bit feedback successive approximation algorithm. It is important to note, however, that any number of bits can be fed back and the particular embodiment described below uses a single bit. The features of this circuit which provide the performance advantages referred to above are principally due to the use of a strobe comparator, low level differential logic, and cermet thin film resistors.

The successive approximation algorithm is well known in the industry. Briefly, this algorithm is characterized by making a series of level comparisons between the input analog signal and the output of a digital-to-analog (D/A) converter which is being stepped through a sequence starting with the most significant bit and ending with the least significant bit. This trial and error quantizing process, starting with the most significant bit and ending with the least significant bit, results in the determination of a binary output code which represents a measure of the analog input signal.

This invention is predicated in part on the use of a strobe comparator in the implementation of the aforementioned algorithm. The use of a strobe comparator in an all-parallel A/D converter has been described previously in an article by the applicant herein published in the International Solid State Circuits Conference Proceedings, Philadelphia, Pennsylvania, dated February, 1972. The purpose of strobing in an all-parallel A/D converter is to obtain minimum acquisition time characteristics. On the other hand, the use of strobing in the present application is to synthesize high gain characteristics and yet maintain large bandwidth performance. This is accomplished by making a low gain comparison of the analog inputs and then after an accurate binary decision is made applying positive feedback to latch that decision. This provides a means of synthesizing high gain performance without using a high gain comparator.

Another feature of the invention is the use of low level differential logic for all digital circuitry. This is a current mode logic form which transmits signals differentially and operates with logic voltage swings below 250 millivolts, and preferably at 200 millivolts, which is significantly below the normal 900 millivolts used in the industry standard emitter coupled logic (ECL) circuitry. This provides exceptionally low power performance at the desired speeds.

Still another feature of the invention is the use of thin film resistors, such as those films made from cermet material. This type of resistor provides minimum parasitic capacitance to the semiconductor substrate, superior component matching and temperature stability, and an opportunity for laser trimming of individual resistors to better than 0.01%. The low parasitic capacitance characteristic allows a reduction of the critical D/A settling time by a factor of 2 or 3 as compared with conventional diffused resistors.

Figure 1:
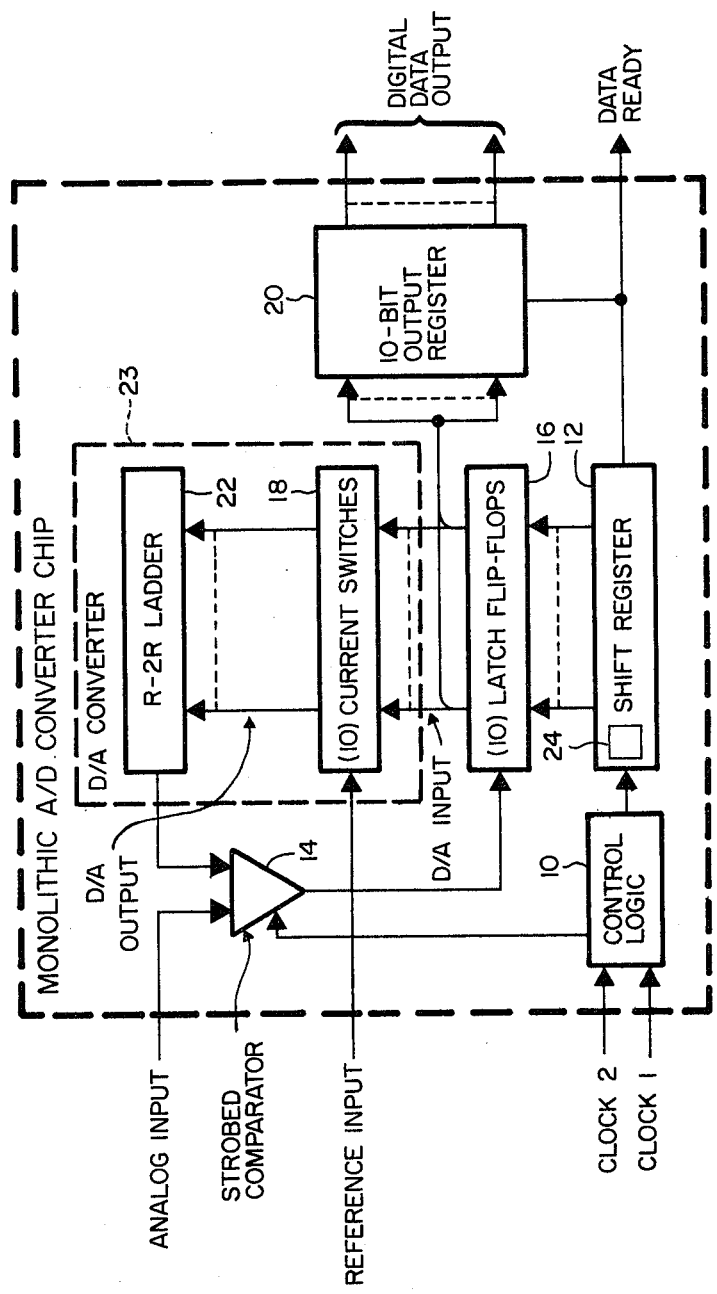
FIG. 1 is a block diagram of an A/D converter incorporating a strobed comparator according to the invention.

FIG. 1 shows a block diagram of the A/D converter which uses the well known successive approximation algorithm. A control logic function 10 distributes clock 1 signal at 5 MHz and clock 2 signal at 60 MHz to a shift register 12 and to the strobe control of a strobed comparator 14. The meaning of the terms strobe or strobing as applied to the comparator 14 will become more apparent as the discussion proceeds. The shift register 12 sets up the proper control signals for sequencing the converter through 12 cycles. The shift register 12 provides a plurality, say 10, of latch flip-flops 16 with the proper control signals to switch a like plurality of current switches 18 and an output register 20 appropriately.

Cycle 1 sets the R-2R ladder 22 of a D/A converter 23 to the center of the analog input range by turning on only the most significant bit. The strobed comparator 14 then compares this mid-range signal with the analog input signal. The control logic 10 immediately strobes the comparator 14 so that this decision is converted to a digital signal which then instructs latch flip-flops 16 to either retain the most significant bit on or turn it off depending upon the results of the comparison made. This decision is made at the end of cycle 2. This reiterative process is repeated one bit at a time, cycle 3 through 11, until the proper state of all 10 bits has been determined. At this time the output of the D/A converter 23 is equal to the analog input signal to within 10-bit accuracy. Also at this time, the computed binary data which resides in latch flip-flops 16 is transferred into the output register 20, during cycle 12, thus providing the correct binary digital data output.

The above described conversion procedure based upon the well known successive approximation algorithm is described in detail in various texts, such as "Analog-to-Digital/Digital-to-Analog Conversion Techniques" by David F. Hoeschele, Jr. published by John Wiley and Sons, New York, New York, 1968. The novel aspect of the above procedure, which is a subject of this invention is the use of the strobed comparator instead of a conventional non-strobed comparator.

The important characteristic of the strobed comparator 14 is the fact that a comparison is made at a very low gain, such as 4. Since this circuit will compare signals to within a tenth of a millivolt difference, this small gain of 4 is not sufficient to create a full digital output swing of 200 millivolts, as required by the low level differential logic. Therefore, as soon as a correct decision has been established, the comparator 14 is strobed or latched-up by introducing 100% positive feedback in such a way that the low level decision is converted into a large digital signal at very high speed. The application of 100% positive feedback renders the comparator insensitive to the input signals. The significance of this is found in the synthesis of a high gain function via latching with positive feedback.

The comparator function is conventionally performed by using a high gain amplifier which will amplify a tenth of a millivolt difference into a 200 millivolt output swing. Such a high gain amplifier must therefore have a relatively low bandwidth. The strobed comparator technique herein described, in contrast, utilized a very low gain to establish an accurate comparison and retain a wide band characteristic, and thus realize fast switching time.

For a more detailed example of the circuitry of a strobed comparator, reference is made to the above-identified February 1972, paper by applicant herein. That paper describes a strobed comparator function which is comprised of an input and output stage. The use of this strobed comparator function in the present application incorporates only the input stage. The digital output of the strobed comparator is compatible with the low level differential logic to be described.

Low level differential logic was initially described at the February 1975, International Solid State Circuits Conference in an article by the applicant herein, in a paper entitled "Applications of Low-Level Differential Logic". This logic form is basically current mode and is characterized by the transmission of logic levels by differential signals. Also, logic voltage swings of 200 millivolts are used instead of the conventional 900 millivolts which is common to industry standard ECL circuitry. This low level of operation is permissible because of the differential nature of the logic form and because the principal signal processing is performed on the integrated circuit chip in a known and well controlled noise environment. Low level operation permits coupling directly without emitter followers in many instances. This provides a very low power performance characteristic for the required high speed application.

Figure 2:
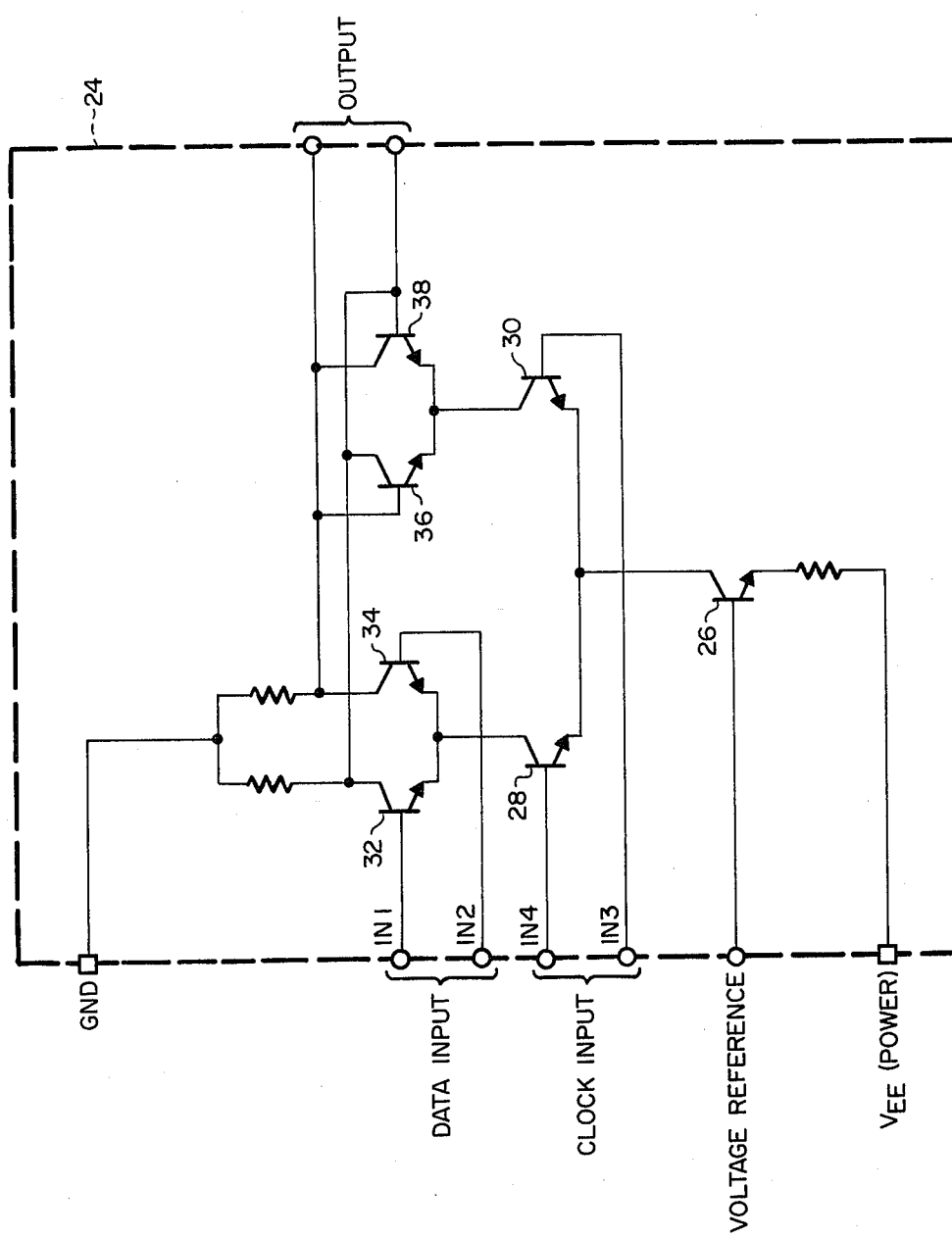
FIG. 2 is a schematic circuit of a typical unit of low level differential logic utilized in the A/D converter.

An example of a single stage of a low level differential logic shift register 24 is shown in FIG. 2. The shift register stage 24 includes a single current source transistor 26, connected to a differential pair clock transistors 28 and 30, which are in turn connected to differential transistor pair 32, 34 which are used to transfer data, and differential transistor pair 36, 38 which are used for latching.

Figure 3:
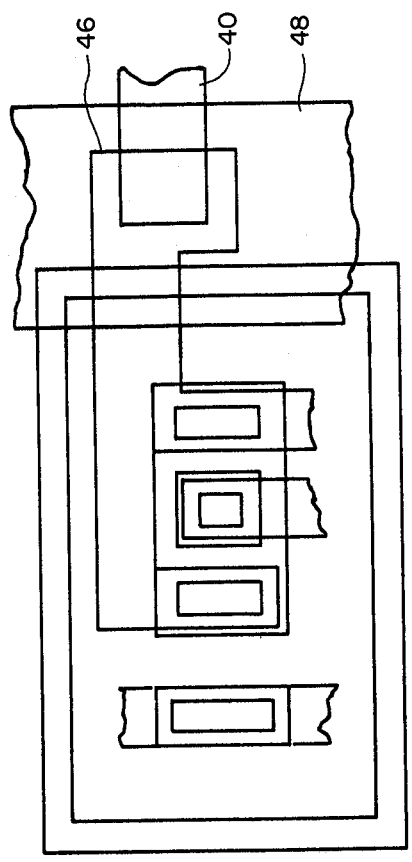
FIG. 3 is a greatly enlarged top plan view of a transistor combined with a thin-film resistor element utilized in the integrated circuitry of the A/D converter.
Figure 4:
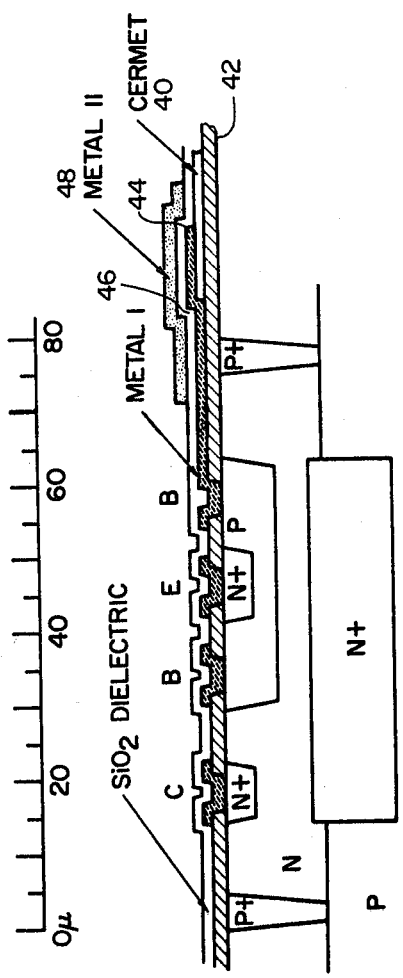
FIG. 4 is a sectional view of the transistor and resistor element shown in FIG. 3.

FIGS. 3 and 4 are, respectively, top plan and cross sectional views of a typical integrated circuit transistor and resistor and their associated interconnect, as incorporated in the subject A/D converter. The fabrication of the transistor structure per se follows conventional semiconductor processing. A unique and important feature of the semiconductor structure is found in the use of thin film resistors, preferably shown in the form of cermet film 40. The cermet film 40 is deposited as shown on a thermal oxide layer 42 which results from the fabrication of the transistor structure. The processing of this integrated structure is completed by evaporating 50 A of titanium followed by 6500 A of aluminum for first level metal interconnect 44 followed by 10,000 A of $SiO_2$ dielectric layer 46, followed by 300 A of titanium followed by 12,000 A of aluminum sputtered second metal interconnect 48.

The significant advantages which result from cermet is found in the low parasitic capacitance to the semiconductor substrate, in the high degree of component matching, in the low temperature coefficient, and the ability to laser trim individual resistors to precise values. The low parasitic capacitance to the semiconductor substrate results in a significant reduction in the critical D/A settling time, namely a 2 to 3 improvement over conventional diffused resistors. This contributes to the high speed operation of the A/D converter. 10 Bit accuracy requires component matching to be of the order of one part out of 5,000. This order of accuracy can be achieved with batch processing by using the thin film resistor process described herein. It is possible to achieve even greater accuracy by laser trimming the appropriate individual resistors within the A/D circuit chip. Trimming precision greater than 0.01% is possible.

The cermet layer 40 is preferably formed by electron beam evaporating in vacuum a mixture of chromium and silicon monoxide to cover the oxide layer 42 as well as the exposed surface of the semiconductor. The proportions by weight of the constituents of the cermet mixture may vary in the range of 65 to 50% for chromium and 35 to 50% for silicon monoxide. The excess cermet material is selectively etched away from the oxide layer 42. Typically, a cermet layer 40 consisting of 60% chromium and 40% silicon monoxide about 500 angstroms thick has a specific resistivity of $1 \times 10^{-3}$ ohm-cm, thereby providing a sheet resistance of 200 ohms per square. A cermet mixture of silicon and chromium has also been successfully used.

It is within the scope of this invention to quantize more than one bit at a time. For instance, trials can be made using two bits at a time instead of the single bit at a time as described above. This can be accomplished by using three strobed comparators, instead of a single one, which are interconnected in such a manner to quantize within a ¼ scale range instead of a ½ scale range as performed by the single bit approach. Similarly, three bits can be fed back at a time, which in turn requires a 7 comparator bank to quantize within a ⅛ scale range.

What is claimed is:

1. An analog-to-digital converter of the type using a successive approximation algorithm to quantize an analog input signal comprising:

clock means providing a first clock signal characterized by a first frequency and a second clock signal characterized by a second frequency that is greater than said first frequency;

shift register means having a plurality of register terminals and being responsive to said first clock signal and operative to sequentially shift a portion of said first clock signal through said register such that said portion of said first clock signal is sequentially applied to said register terminals at said second frequency;

latch means comprised of current-mode differential logic that is required to be driven by a binary digital signal having a relatively high voltage, said latch means being responsive to the signal applied on said register terminals and said binary digital signal and operative to store $n$ bits of information regarding the state of said binary digital signal, where $n$ is an integer, to develop $n$ sequencing signals starting with the most significant bit and ending with the least significant bit and further to produce a binary output signal corresponding to said $n$ bits of stored information when said shift register has been sequenced through said plurality of register terminals, said binary output signal being representative of the magnitude of the analog input signal;

digital-to-analog converter means responsive to said sequencing signals and operative to sequentially and cyclically provide $n$ reference signals, each being representative of a predetermined voltage in accordance with the binary weighted value of the sequencing signals; and comparator means including a first input terminal for receiving the analog input signal, a second input terminal for sequentially receiving each said reference signal, a control terminal for receiving said second clock signal and an output terminal and being switchable between a first and a second electrical configuration in response to said second clock signal, said first configuration having a relatively low amplification factor and serving to develop an intermediate signal when the magnitude of said reference signal exceeds that of said analog input signal, said second configuration having a relatively large amplification factor and including positive feedback, said second configuration being responsive to said intermediate signal and operative to amplify said intermediate signal so as to provide said binary digital signal on said output terminal, said positive feedback serving to latch said binary digital signal independent of the signals applied to said first and second input terminals, thereby rendering said second configuration insensitive to said analog input signal and said reference signal, said binary digital signal serving to drive said latch means, said latch means serving to store said information regarding the state of said binary digital signal and to produce said binary output signal representative of the magnitude of said analog input voltage.

2. The invention according to claim 1, wherein said entire A/D converter is integrated in a single semiconductor chip.

* * * * *